United States Patent
Mudivarthi et al.

(10) Patent No.: US 9,269,894 B2
(45) Date of Patent: Feb. 23, 2016

(54) ISOLATION OF MAGNETIC LAYERS DURING ETCH IN A MAGNETORESISTIVE DEVICE

(71) Applicant: Everspin Technologies, Inc., Chandler, AZ (US)

(72) Inventors: Chaitanya Mudivarthi, Chandler, AZ (US); Sarin A. Deshpande, Chandler, AZ (US); Sanjeev Aggarwal, Scottsdale, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/296,153

(22) Filed: Jun. 4, 2014

(65) Prior Publication Data

US 2015/0102006 A1  Apr. 16, 2015

Related U.S. Application Data

(60) Provisional application No. 61/890,984, filed on Oct. 15, 2013.

(51) Int. Cl.
*H01L 43/12* (2006.01)
*H01L 43/08* (2006.01)
*H01L 27/22* (2006.01)

(52) U.S. Cl.
CPC .............. *H01L 43/12* (2013.01); *H01L 27/222* (2013.01); *H01L 27/228* (2013.01); *H01L 43/08* (2013.01)

(58) Field of Classification Search
CPC combination set(s) only.
See application file for complete search history.

(56) References Cited

U.S. PATENT DOCUMENTS

| | | |
|---|---|---|
| 8,119,424 B2 | 2/2012 | Mather et al. |
| 8,747,680 B1 | 6/2014 | Deshpande et al. |
| 2002/0076579 A1* | 6/2002 | Hanawa et al. ......... 428/694 TS |
| 2003/0151859 A1* | 8/2003 | Hayashi et al. ............ 360/324.2 |
| 2003/0180968 A1* | 9/2003 | Nallan et al. ...................... 438/3 |
| 2005/0157544 A1* | 7/2005 | Min et al. ........................ 365/171 |
| 2010/0117169 A1* | 5/2010 | Anderson et al. ............. 257/421 |
| 2012/0068282 A1* | 3/2012 | Matsuoka et al. ............ 257/421 |

OTHER PUBLICATIONS

PCT Search Report in Application No. PCT/US14/59906 dated Nov. 14, 2014, 14 pages.

* cited by examiner

*Primary Examiner* — Duy Deo
*Assistant Examiner* — Erin Bergner

(57) ABSTRACT

Isolation of magnetic layers in the magnetoresistive stack is achieved by passivation of sidewalls of the magnetic layers or deposition of a thin film of non-magnetic dielectric material on the sidewalls prior to subsequent etching steps. Etching the magnetic layers using a non-reactive gas further prevents degradation of the sidewalls.

24 Claims, 13 Drawing Sheets

US 9,269,894 B2

ISOLATION OF MAGNETIC LAYERS DURING ETCH IN A MAGNETORESISTIVE DEVICE

CROSS REFERENCE TO RELATED APPLICATION

This application claims priority to U.S. Provisional Application No. 61/890,984 filed Oct. 15, 2013. The contents of that provisional application are incorporated by reference herein in their entirety.

TECHNICAL FIELD

The disclosure herein relates generally to magnetoresistive devices and more particularly to isolation of magnetic layers during etch in the manufacture of such devices.

BACKGROUND

Magnetoresistive memory devices store information by varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetic layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the orientation of the free portion. The information is later retrieved by sensing the orientation of the free portion. Such magnetic memory devices are well known in the art.

Writing magnetic memory cells can be accomplished by sending a spin-polarized write current through the memory device where the angular momentum carried by the spin-polarized current can change the magnetic state of the free portion. One of ordinary skill in the art understands that such a current can either be directly driven through the memory cell or can be the result of applying one or more voltages where the applied voltages result in the desired current. Depending on the direction of the current through the memory cell, the resulting magnetization of the free portion will either be parallel or antiparallel to the fixed portion. If the parallel orientation represents a logic "0", the antiparallel orientation may represent a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

Manufacturing magnetoresistive devices, including MTJ devices, includes a sequence of processing steps during which many layers of materials are deposited and then patterned to form a magnetoresistive stack and the electrodes used to provide electrical connections to the magnetoresistive stack. The magnetoresistive stack includes the various layers that make up the free and fixed portions of the device as well as one or more dielectric layers that provide at least one the tunnel junction for the MTJ device. In many instances, the layers of material are very thin, on the order of a few or tens of angstroms. Similarly, the dimensions of such layers after patterning and etching are extremely small, and small deviations or imperfections during processing can have a significant impact on device performance.

Because an MRAM device may include millions of MTJ elements, precise processing steps used in manufacturing the devices can contribute to increased densities by allowing devices to be placed in close proximity without unwanted interaction. Moreover, such accurate processing helps to minimize deviations in device characteristics, such as switching voltages, across devices included in the MRAM. Therefore, it is desirable to provide techniques for manufacturing such devices that support increased densities and promote minimizing the variance of certain characteristics amongst devices.

DETAILED DESCRIPTION

Figure 1:
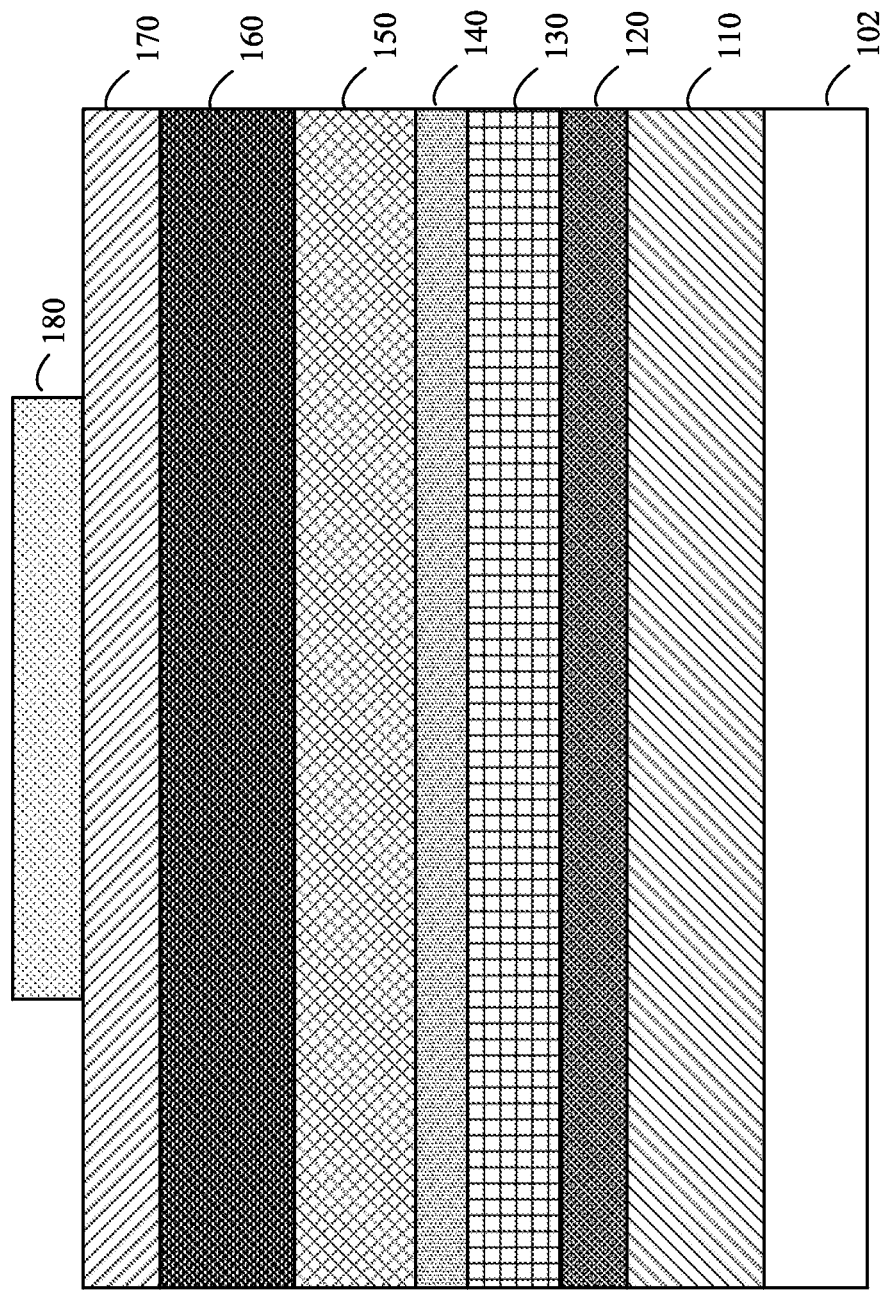
FIGS. 1-4 illustrate cross-sectional views of layers included in a magnetoresistive device during different stages of the manufacturing of a magnetoresistive device in accordance with exemplary embodiments.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to improve understanding of the example embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Moreover, while certain layers and features are illustrated with straight 90-degree edges, in actuality or practice such layers may be more "rounded" and gradually sloping.

The terms "comprise," "include," "have" and any variations thereof are used synonymously to denote non-exclusive inclusion. The term "exemplary" is used in the sense of "example," rather than "ideal."

During the course of this description, like numbers may be used to identify like elements according to the different figures that illustrate the various exemplary embodiments.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. An etch may then be applied to the underlying layer not protected by the remaining resist such that the layer overlying the substrate is patterned. Alternatively, an additive process can be used in which a structure is built up using the photoresist as a template.

There are many inventions described and illustrated herein, as well as many aspects and embodiments of those inventions. In one aspect, the described embodiments relate to, among other things, methods of manufacturing a magnetoresistive-based device having one or more electrically conductive electrodes or conductors on either side of a magnetic material stack. As described in further detail below, the magnetic material stack may include many different layers of material, where some of the layers include magnetic materials, whereas others do not. In one embodiment, the methods of manufacturing include forming the layers for the magnetoresistive device and then masking and etching those layers to produce a magnetic tunnel junction (MTJ) device. Examples of MTJ devices include transducers such as electromagnetic sensors as well as memory cells.

Magnetoresistive devices are typically formed to include a top electrode and a bottom electrode that permit access to the device by allowing for connectivity to other circuit elements. Between the electrodes is a set of layers, including a fixed layer and a free layer on either side of a dielectric layer that forms a tunnel barrier. In some embodiments, the fixed layer achieves its fixed magnetization based on interaction with an antiferromagnetic material. In other embodiments, the fixed magnetization may be achieved through other means, including the manner in which the fixed layer was formed, shape anisotropy, etc. In manufacturing such magnetoresistive devices, a set of layers is first deposited on the wafer and then patterned and etched in multiple steps in order to define the electrodes and the various layers there between. Some of the materials included in the layers within the magnetoresistive device are susceptible to oxidation or other degradation during reactive etching steps. Such oxidation or degradation can be detrimental as it may interfere with the magnetic behavior of the device or interfere with subsequent processing steps. In particular, sidewalls of the layers of magnetic material included in the free or fixed layer may be vulnerable to degradation during etching operations corresponding to underlying layers. In addition to the being subject to possible degradation based on exposure to etching chemistries, the sidewalls may also be impacted by veils that are formed by residual material in the subsequent etching operations.

In order to avoid undesirable impacts on magnetic layers included in the magnetoresistive device stack structure, one technique described herein provides for a three step process in order to define the lower portion of the magnetoresistive device stack structure. Instead of using a single step etch to define the layers in the lower portion of the magnetoresistive device, that etching operation is split into a first etch, which defines one or more magnetic layers; an encapsulation step, which coats and protects the sidewalls of one or more of the magnetic layers defined in the first etch; and a second etch, which defines the remaining layers in the magnetoresistive stack. The encapsulation may be accomplished by oxidation, nitridization, or exposure of the sidewalls to a corrosive gas to provide controlled corrosion of the sidewalls. In other embodiments, the encapsulation may be accomplished by depositing a layer of liner material on the sidewalls, where the liner material is non-magnetic dielectric material.

Following encapsulation, the layers underlying the encapsulated layer are etched, where such etching may utilize corrosive gases that normally would degrade the layer (or layers) that has been encapsulated. However, the encapsulation protects those layers, thereby preventing such degradation. In addition to protecting the layers from degradation, the encapsulation can also isolate the layers from residual matter (e.g. veils resulting from the etching of underlying layers). Such residual matter can include magnetic matter (e.g. cobalt, iron, etc.), antiferromagnetic matter (e.g. ruthenium, platinum manganese, etc.), or non-magnetic matter (platinum, tantalum, etc.). For example, antiferromagnetic material such as platinum manganese (PtMn) may, in response to etching, leave behind residual material, such as platinum or platinum manganese, that tends to adhere to the sidewalls of magnetic layers. Encapsulation of those magnetic layers prevents the residual material (veils) from contacting the magnetic layers and impacting the switching characteristics of the magnetoresistive device.

By avoiding undesirable impacts on magnetic layers due to subsequent etching steps, the characteristics of the magnetoresistive device are improved in terms of consistency. For example, the removal of the impact of veils that include pinning sites (i.e. microscopic pinned sites that make it harder for the free layer to switch) ensures that the reading and writing characteristics for the device stay within a narrower deviation from expected values. The inconsistent presence or absence of such pinning sites can cause greater deviation in switching characteristics amongst magnetoresistive devices in applications such as memory devices. In such memory devices, minimizing deviations in terms of device working characteristics helps ensure accurate operation and enables smaller current to be applied for reading and writing bit cells.

In addition to utilizing encapsulation between the first and second etching operations in the three-step process, further benefits may be realized by using a non-reactive gas during the first etching operation. For example, a nonreactive gas may be used to define the magnetic layers below the tunnel junction, where such layers are typically relatively thin. Because a nonreactive gas is used for such etching, as the sidewalls of the layers are exposed during the etching, they do not react to the nonreactive gas. Following definition of the magnetic layers, encapsulation occurs, thereby protecting the layers from further etching steps that often rely on more reactive gases.

FIG. 1 illustrates a cross-sectional view of a partially formed magnetoresistive device disposed on a substrate 102. The cross-sectional view shows a plurality of layers, where each of the layers is formed, deposited, grown, sputtered, or otherwise provided. The layers may be deposited using any technique now known or later developed. The simplified cross-sectional view presented in FIG. 1 includes electrically conductive layer 110, antiferromagnetic layer 120, lower magnetic material layer 130, dielectric layer 140, upper magnetic material layer 150, electrically conductive layer 160, hard mask layer 170, and patterned photoresist layer 180. The patterned photoresist layer 180 may be deposited and patterned using any technique now known or later developed, for example, well known conventional deposition and lithographic techniques.

The electrically conductive layers 110 and 160 provide the material used to define the top and bottom electrodes for the magnetoresistive device. While illustrated to include example layers 120-150, the remaining layers within the magnetoresistive stack may include a number of different layers of both magnetic and nonmagnetic material. For example, the layers may include multiple layers of magnetic material, dielectric layers that provide one or more tunnel barriers or diffusion barriers, coupling layers between layers of magnetic material that provide for ferromagnetic or antiferromagnetic coupling, anti-ferromagnetic material, and other layers utilized in magnetoresistive stacks as currently known or later developed. For example, the lower layer of magnetic material may include a set of layers forming a synthetic antiferromagnetic structure (SAF), the dielectric layer 140 may correspond to a tunnel barrier, and the upper layer of magnetic material 150 may include a set of layers corresponding to a synthetic ferromagnetic structure (SYF). In another embodiment, in addition to the example layers shown, a further dielectric layer is included above the upper magnetic material layer 150 forming a diffusion barrier, and a spacer layer is positioned between that diffusion barrier and the electrically conductive layer 160. Notably, each of the layers shown to be included in the magnetoresistive device may be a composite layer that includes multiple sub-layers. Other embodiments may include multiple SAFs, SYFs, and tunnel barriers in addition to the other layers, where the materials and structures are arranged in various combinations and permutations now known or later developed.

Figure 2:
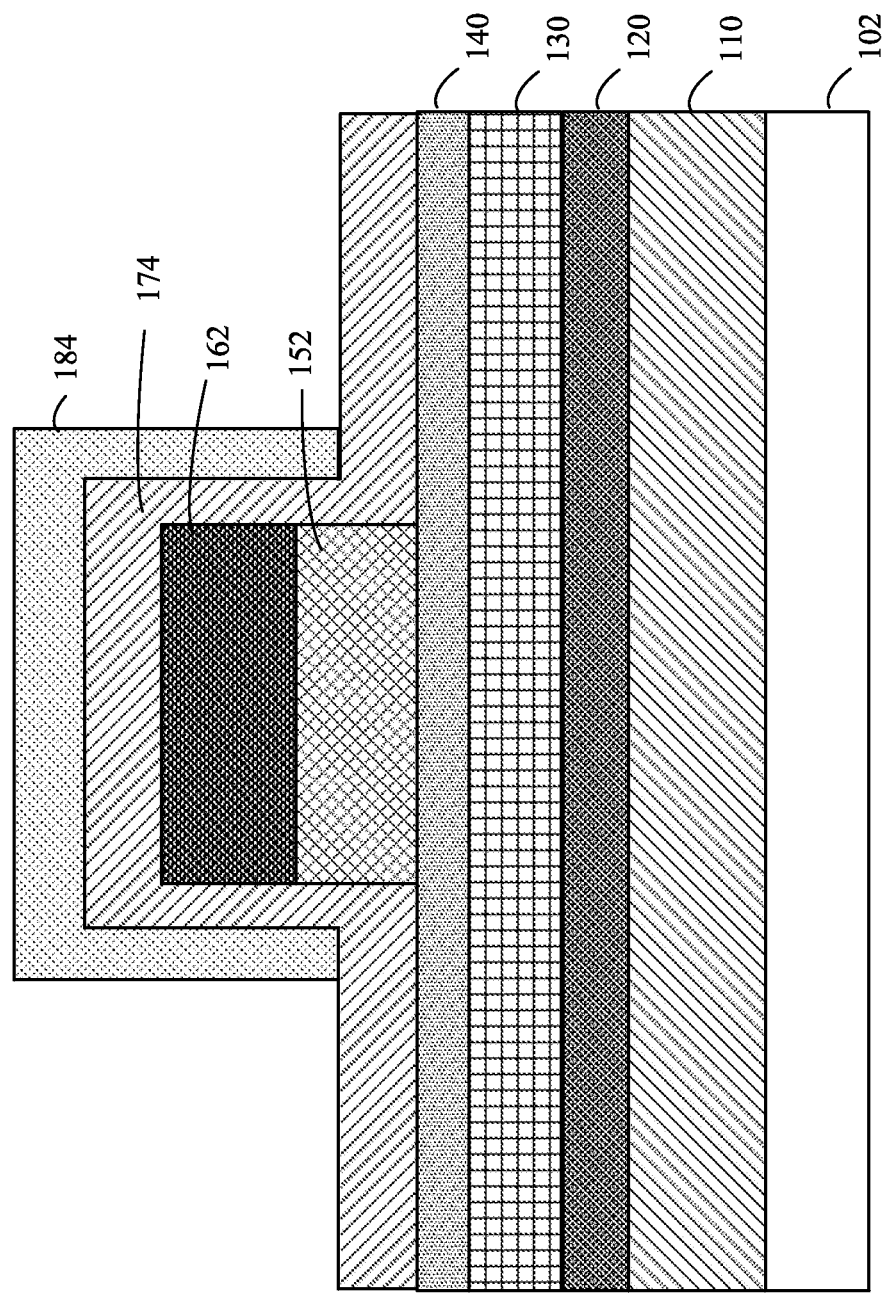

In FIG. 2, the cross-sectional view of FIG. 1 is updated to reflect the formation of the top electrode 162 from the electrically conductive layer 160 as well as the further definition of the upper magnetic material layer 150 to form the upper magnetic portion of the stack structure 152. In addition, a new layer of hard mask material 174 has been deposited, and a new layer of patterned photoresist 184 has been deposited and patterned in preparation for the etching operations corresponding to the lower portion of the magnetoresistive device. Each of these etching and formation steps may be accomplished using known or later developed techniques. One of ordinary skill in the art appreciates that the cross-sectional views are not drawn to scale and should not be viewed as representing proportional relationships between different layers. Rather the cross-sectional views are provided to help illustrate the processing steps performed by simplifying the various layers to show their relative positioning. For example, the hard mask layer 174 illustrated in FIG. 2 may be three or more times as thick as the sum of the thicknesses of all of the underlying layers making up the device. Moreover, while the hard mask 174 and patterned photoresist 184 are shown with straight 90-degree edges, in actuality such layers may be more "rounded" and gradually sloping.

The top electrode 162 may be formed using a two-step etch process such as that described in co-pending U.S. patent application Ser. No. 14/296,181 entitled "Method for Top Electrode Etch in a Magnetoresistive Device and Devices Manufactured Using Same," which is incorporated by reference herein. In other embodiments, the top electrode 162 is formed using other techniques, both known and later developed. In one embodiment the upper magnetic portion 152 of the stack structure corresponds to the free layer, or free portion, of the stack structure. In such an embodiment, the upper magnetic portion 152 may be a SYF structure that includes multiple magnetic layers and one or more associated coupling layers. In other embodiments, the upper magnetic portion 152 may correspond to the fixed layer, or fixed portion, of the stack structure. In such embodiments, the fixed layer may include a SAF structure, or some other layer of magnetic material that has a fixed magnetic orientation.

Figure 3:
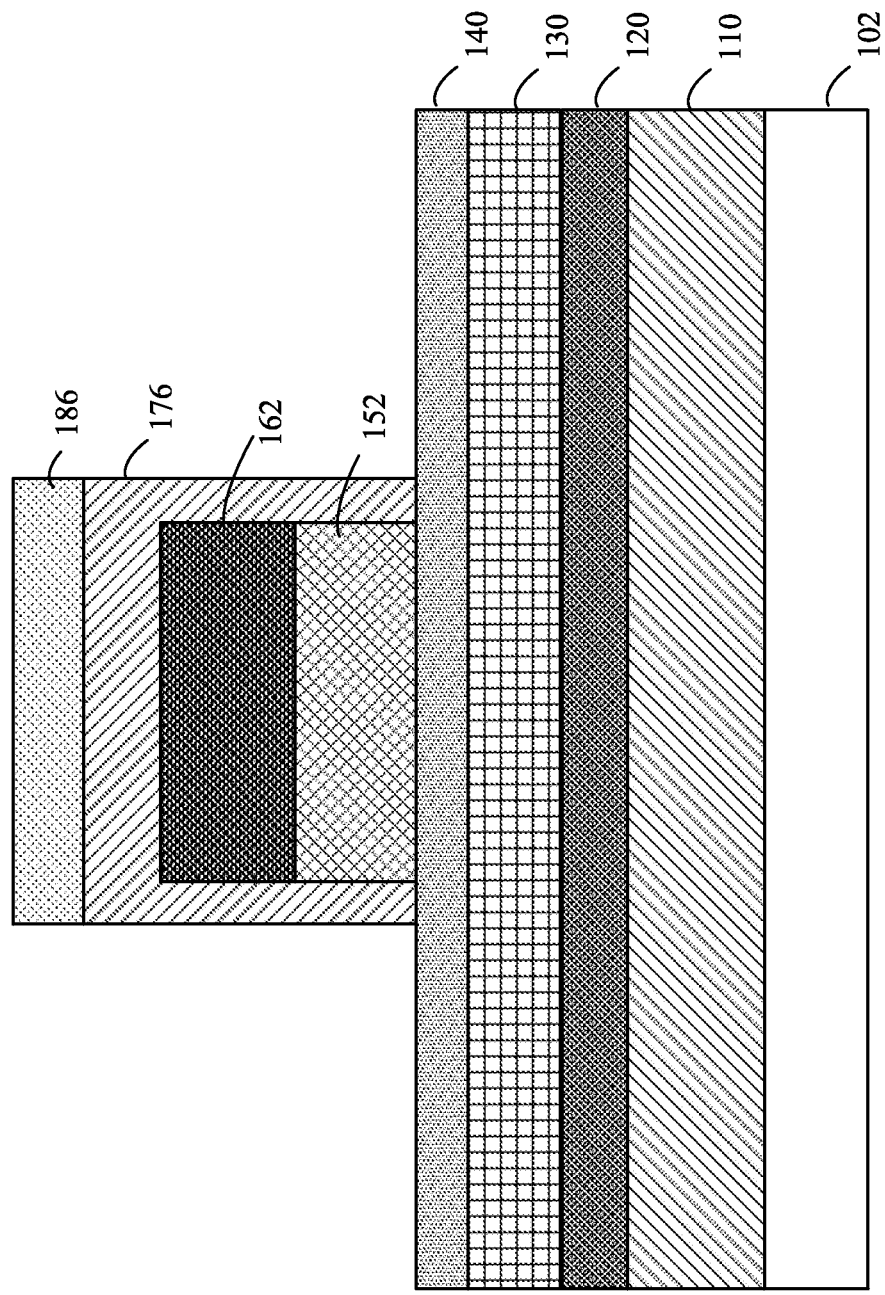

Moving to FIG. 3, the cross-sectional view reflects a partial etch having been performed. The partial etch defines a new patterned layer of photoresist 186, defines an underlying hard mask 176, and exposes certain portions of the dielectric layer 140. The hard mask 176 provides a template for the definition of the lower portion of the magnetoresistive device stack. As used herein, "hard" when used with "hard mask" means the ability to resist a particular etch. Examples of chemical etch processes to form the hard mask include those using gases such as $CF_4$, $CHF_3$, $CH_2F_2$ and carrier gases such as Ar and Xe. Notably, the hard mask 176 may be etched, formed and/or patterned using any etchants and techniques now known or later developed—for example, using conventional etchants and techniques. Following definition of the hard mask, the pattern layer of photoresist 186 may be removed.

Figure 4:
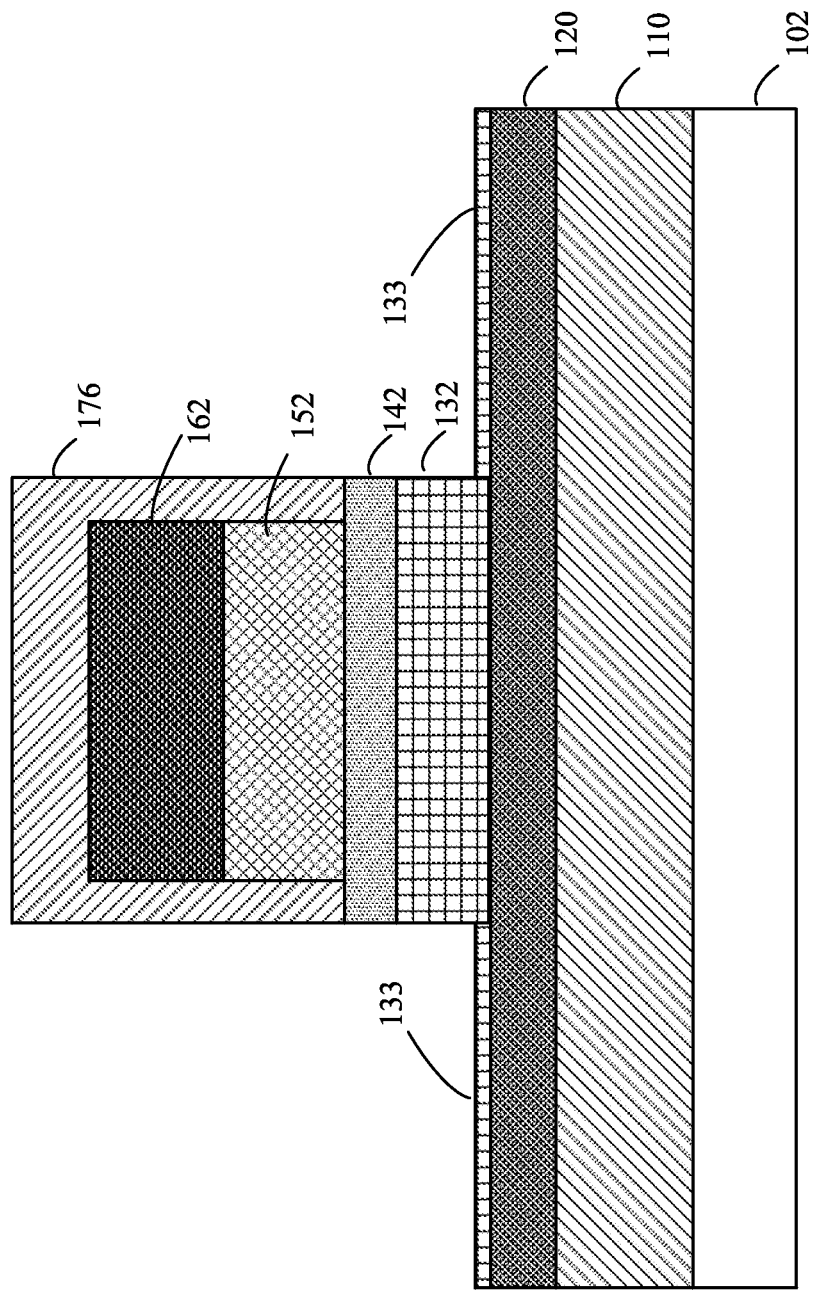

FIG. 4 shows the cross-sectional view from FIG. 3 following a first etching step during which the dielectric layer 140 and some or all of the lower magnetic material layer 130 are etched to form etched dielectric layer 142 and etched lower magnetic layer 132, respectively. The etched dielectric layer 142 may form a tunnel junction between the upper layer of magnetic material 152 and the lower layer of magnetic material 132. The etching performed that results in the layers depicted in FIG. 4 may include etching nearly all of the lower layer of magnetic material 130 to produce the remaining magnetic material 132 included in the stack. As shown, a small amount of residual material 133 may be left overlying the anti-ferromagnetic material 120. In other embodiments, the first etching step may continue such that all of the lower layer of magnetic material 130 not underlying the hard mask layer 176 is etched away. Moreover, in yet other embodiments, a portion of the layer underlying the lower layer of magnetic material 130 may also be removed during this etching process. For example, in the embodiment illustrated in FIG. 4, this first etch of the lower portion of the magnetoresistive device stack may continue through the lower layer of magnetic material 130 and into the antiferromagnetic material 120.

In an embodiment where the lower layer of magnetic material 130 includes a plurality of layers that form a SAF structure when etched, this first etching step may etch through the tunnel barrier 140 and then through all of the layers making up the SAF structure, only stopping when the antiferromagnetic material layer 120 is reached. Determining when to stop this first etch may be based on a preset time or based on detection of an endpoint wavelength using optical emission spectroscopy. Optical emission spectroscopy can be used to detect when the spectrum corresponding to material of the magnetic material layer 130 begins to fall, thereby indicating that the first etch has almost reached the bottom of the layer of magnetic material. In other embodiments, the optical omission spectroscopy can detect when antiferromagnetic material begins to appear, thereby indicating that etching into the antiferromagnetic material layer 120 has begun.

Because the dielectric material included in the tunnel barrier 142 and the material included in the magnetic layer 132 may be susceptible to degradation from a corrosive etch, in one embodiment the first etching step utilizes a nonreactive gas. For example, argon (Ar), xenon (Xe), or other nonreactive gases including the noble gases can be used to etch through the layer corresponding to the tunnel barrier 142 and the lower layer of magnetic material 132, where such nonreactive gases prevent oxidation or other degradation of the tunnel barrier 142 and lower layer of magnetic material 132 during that etching process. While it may be advantageous to use a nonreactive gas during this first etching operation, the layers being etched are relatively thin, and therefore a reactive etch may be used as the oxidation and degradation of the layers 142 and 132 may be small and, in some instances, within a tolerable range such that it does not interfere with further device processing or operation.

Figure 5:
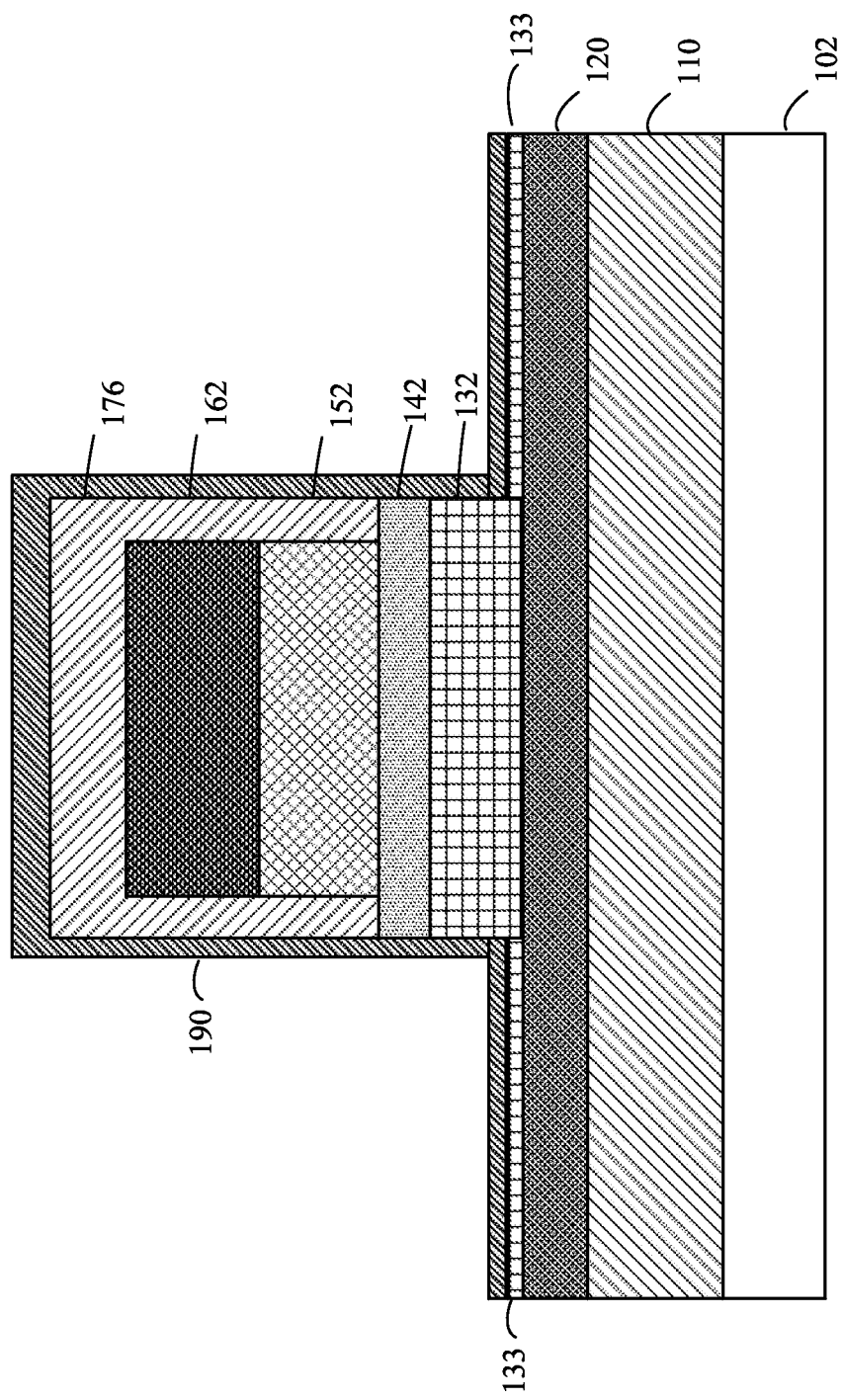
FIGS. 5-7 illustrate a cross-sectional views of layers included in a magnetoresistive device during different stages of the manufacturing of a magnetoresistive device in accordance with an exemplary embodiment.

FIG. 5 illustrates a cross-sectional view corresponding to FIG. 4 following encapsulation of the sidewalls and other exposed portions of the stack. In the embodiment illustrated in FIG. 5, the encapsulation material includes a layer of a liner material 190 that is deposited on the sidewalls and other exposed portions of the partially formed structure. The liner material 190 that is deposited is preferably a nonmagnetic dielectric material that is able to protect the sidewalls from oxidation or other degradation. In some embodiments, the liner material also prevents electrical or magnetic interference resulting from residual material (e.g. platinum or other veil-forming materials) left over after subsequent etching steps.

The layer of liner material 190 may be deposited using chemical vapor deposition (CVD), atomic layer deposition (ALD), or using other deposition techniques now known or later developed. The layer of liner material 190 is relatively thin, and may include materials such as a silicon oxide such as $SiO_2$, a silicon nitride such as $Si_3N_4$, an aluminum oxide such as $Al_2O_3$, or a magnesium oxide such as MgO, either alone or in various combinations. In some embodiments, the layer of liner material 190 may be of a thickness of less than 1000 Å, whereas in other embodiments, the layer of liner material 190 is less than 300 Å. While layer of liner material 190 is shown to cover the sidewalls of the entire stack structure illustrated in FIG. 5, in other embodiments, the sidewalls of the exposed magnetic layers immediately above the anti-ferromagnetic layer 120 may be the only layers that are encapsulated in this manner. In other embodiments, any layers that are subject to subsequent exposure to reactive etching chemistries and which may be degraded by that exposure may be encapsulated by the layer of liner material 190 in order to protect those layers during the subsequent etching operations. In yet other embodiments, if the first etching extends into a portion of the layers underlying the magnetic layer 130, the encapsulation may extend to cover the exposed sidewalls corresponding to the underlying layers as well.

Figure 6:
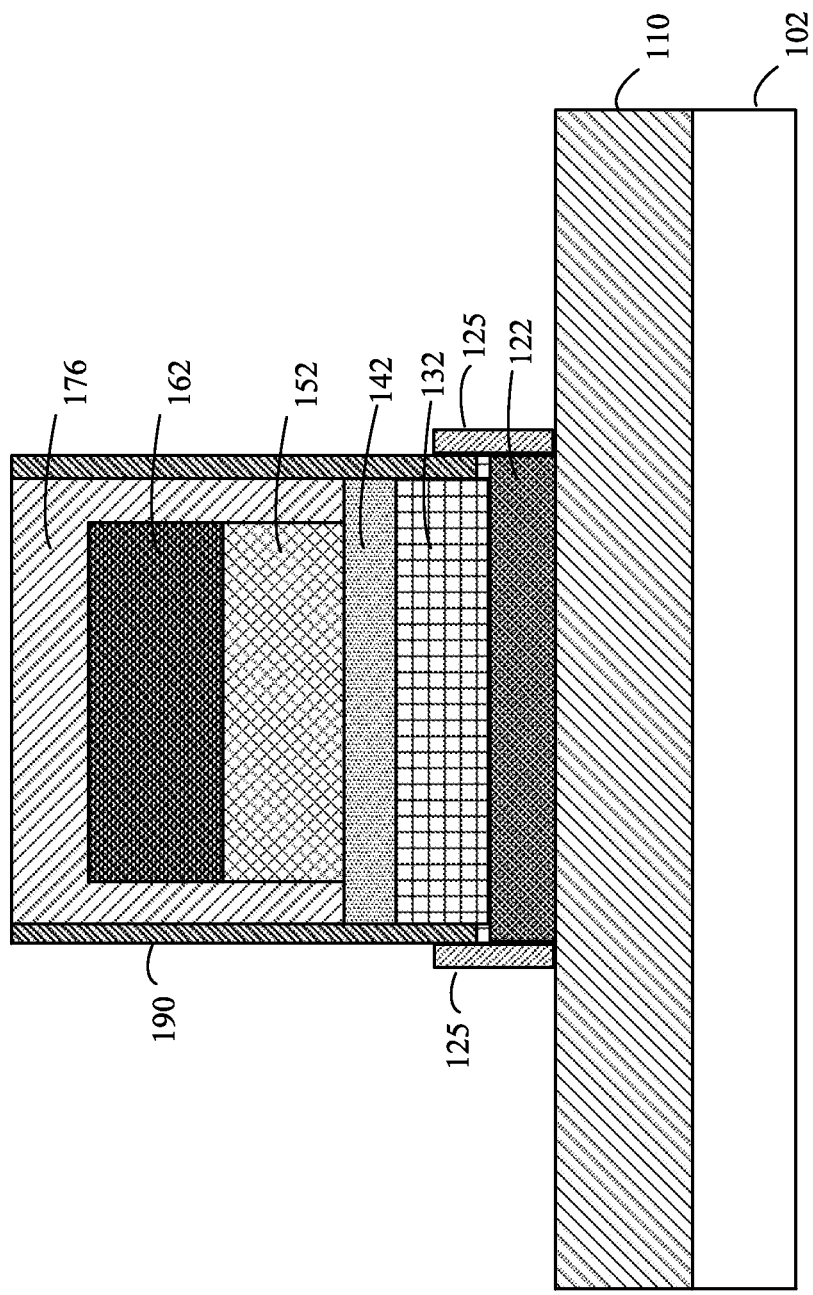

FIG. 6 represents the cross-sectional view of FIG. 5 following a second etching step in the development of the lower portion of the magnetoresistive device stack. During the second etching operation, the layers underlying the magnetic layers encapsulated are etched. Typically, the second etching operation utilizes a mixture of noble gases such as Argon, Nitrogen, Krypton, Xenon and corrosive gases, such as chlorine, methanol, oxygen, bromine, or other halogen containing gases such as $CHxF4-x$ where x is an integer between 0 and 4. Such reactive gases help flush out residual material between neighboring magnetoresistive device structures on an integrated circuit. Removing such material allows for smaller separation between the devices and increased density. The encapsulation material in the form of the layer of liner material 190 protects vulnerable layers within the magnetoresistive device stack from exposure to such corrosive gases, thereby preventing their oxidation or other degradation.

In the embodiment shown in FIG. 6, the second etching step includes etching the antiferromagnetic material layer 120 to form the portion of the antiferromagnetic material 122 included in the magnetoresistive device stack. In other embodiments, the etching of the layers below the magnetic layers encapsulated includes etching other magnetic layers, other nonmagnetic layers, or electrically conductive layers, such as the layer 110 from which the lower electrode is formed. For example, in an embodiment where the top magnetic portion of the magnetoresistive device stack corresponds to the fixed layer, there may not be antiferromagnetic material underlying the lower magnetic layers within the device stack. However, the etching process used to develop the lower electrode or that used to etch through additional layers underlying the lower magnetic portion may be reactive and result in degradation of the magnetic layers already etched if they are not encapsulated. As such, encapsulation provides advantages regardless of the particular materials etched subsequent to the encapsulation.

As shown in FIG. 6, the second etching step also removes some of the horizontal aspects of the encapsulation material (i.e. layer of liner material) 190. In order to ensure the layer of liner material 190 includes enough encapsulation material to adequately protect the sidewalls, knowledge as to how much of the encapsulation material will be removed during the second etch can be used to determine the appropriate thickness for the deposited encapsulation material. For example, the thickness should be adequate to preserve the vertical components of the encapsulation material 190. For example, the topmost portions of the vertical segments of the encapsulation material 190 illustrated in FIG. 6 retain generally sharp edges, and the subsequent etching has not eroded away the portions of the encapsulation material 190 intended to protect the magnetic layers. In some embodiments, a thickness of 20 Å may be enough material to provide the needed protection.

In the example embodiment illustrated in FIG. 6, etching the antiferromagnetic material 120 results in veils 125, which represent residual materials that are not adequately removed by the second etching step. For example, if the underlying layer of material 120 is an antiferromagnetic material such as platinum manganese, the veils 125 may represent residual magnetic material including platinum, manganese, cobalt, iron, or ruthenium, not adequately removed during etching. The material making up the veils 125 may depend on where the previous etching operation stopped. If allowed to contact the magnetic layer 132, such residual veils 125 could interfere with the switching characteristics of the magnetoresistive device. However, as shown in FIG. 6, the encapsulation material protects most if not all of the magnetic layer 132 from any such interference from the veils 125.

While FIG. 6 shows the etching process for the lower portion of the stack to be split into two etching steps that are separated by an encapsulation step, it is contemplated that additional etching and encapsulation steps may occur. For example, the tunnel barrier 142 may be formed by a first etch, and then the resulting tunnel barrier is encapsulated. After encapsulation of the tunnel barrier, a second etch forms a portion of the lower layer of magnetic material 132, which may also then be encapsulated. Following that encapsulation, more etching and encapsulation steps may occur, where each layer of material may be separately etched and encapsulated. After such multiple etch and encapsulate iterations, the final etching to define the magnetoresistive device may be performed with less concern for degradation of the encapsulated layers.

Figure 7:
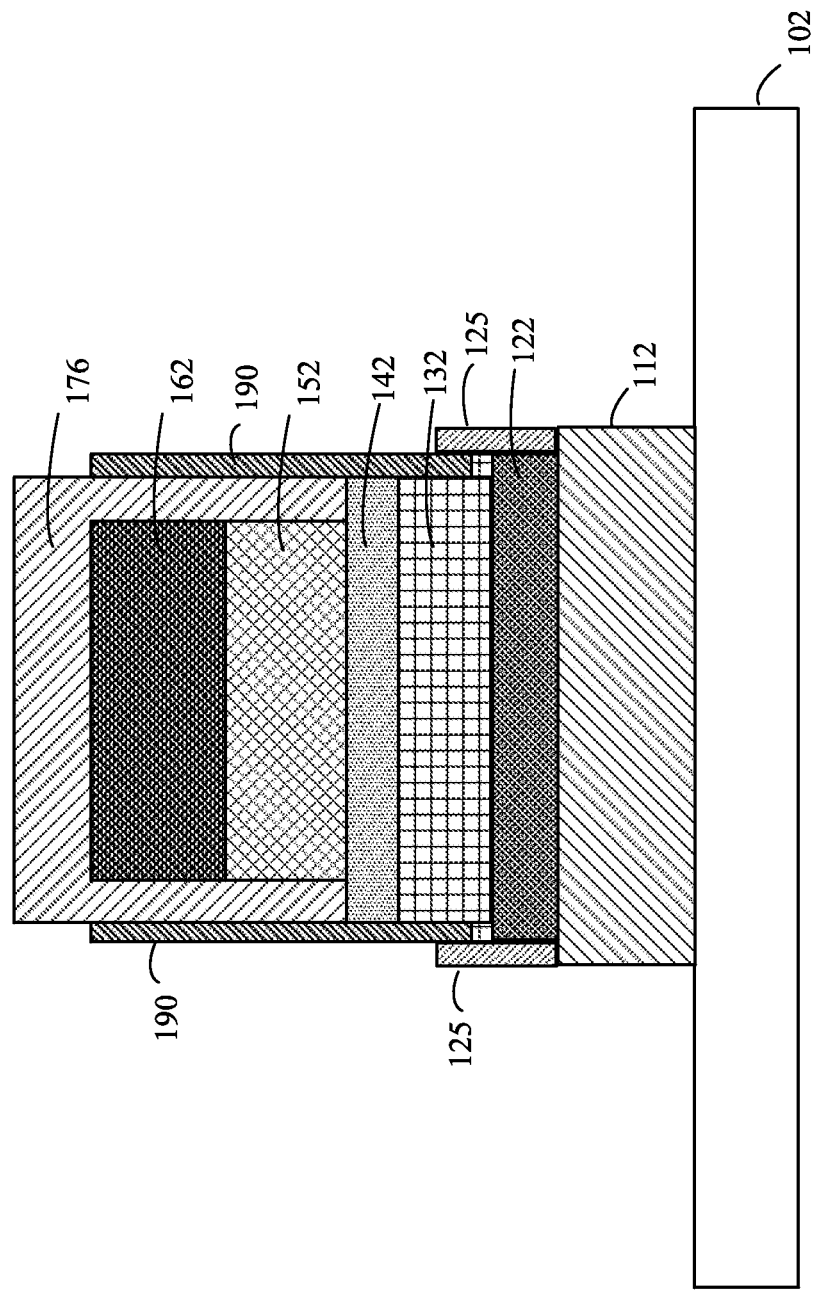

FIG. 7 shows the cross-sectional view of FIG. 6 following definition of the bottom electrode 112 from the lower layer of electrically conductive material 110. In some embodiments, the formation of the bottom electrode 112 may include corrosive etching that could negatively impact the lower magnetic layer 132 and tunnel barrier 142 if those layers were exposed to the corrosive etching chemistry. By encapsulating the sidewalls of those layers prior to performing such corrosive etching steps, the layers are protected from such unwanted degradation. The top electrode 162 and the bottom electrode 112 enable the magnetoresistive device to be connected to other circuit elements. The hard mask 176 overlying the top electrode 162 is typically not removed until after the etching used to form the bottom electrode is complete, as the hard mask 176 protects the top electrode 162 during that etching process. In order to provide access to the top electrode 162, the horizontal portion of the hard mask 176 may be later removed by, for example, a polishing step that exposes the top electrode 162.

Figure 8:
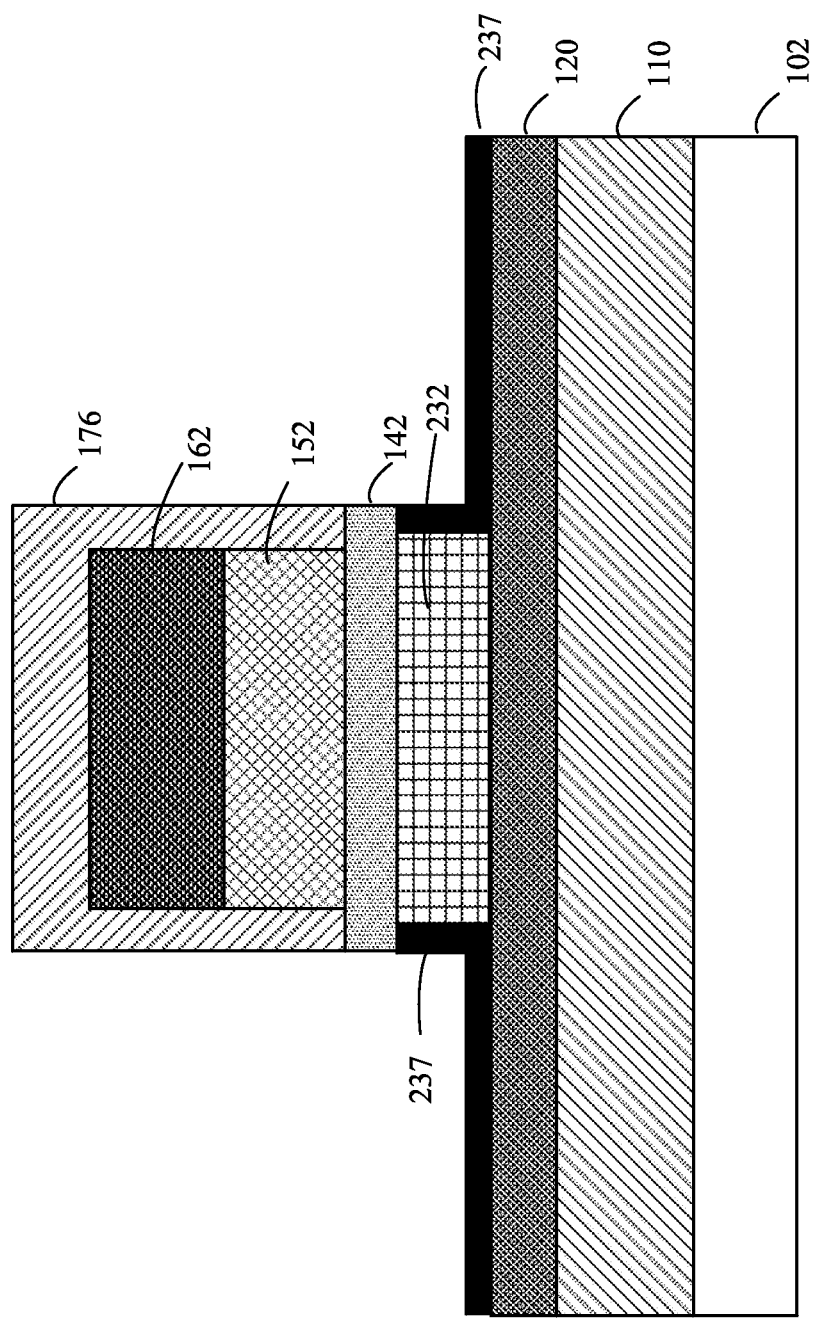
FIGS. 8-10 illustrate a cross-sectional views of layers included in a magnetoresistive device during different stages of the manufacturing of a magnetoresistive device in accordance with another exemplary embodiment.

FIG. 8 shows a cross-sectional view corresponding to FIG. 4 following encapsulation according to a different embodiment than that illustrated in FIGS. 5-7. Thus, the processing leading up to the cross-sectional view of FIG. 4 discussed above is also appropriate with respect to the embodiment corresponding to FIGS. 8-10. In FIG. 8, rather than depositing liner material overlying the exposed portions of the device, the exposed portions of magnetic layer 130 are oxidized, nitridized, or exposed to a corrosive gas to provide controlled corrosion. Thus, encapsulation material 237 shown in FIG. 8 results from the magnetic or other material included in the layer 130 reacting with the corrosive gas. Although not shown, the tunnel barrier 142 may also react to the corrosive gas, thereby providing encapsulation for that layer as well. Following encapsulation by exposure rather than deposition, the underlying layers 120 and 110 can be etched using reactive etches with reduced concern for those etches reacting with exposed sidewalls of the magnetic layer 232.

One of ordinary skill in the art appreciates that while two specific examples of encapsulation techniques are provided herein, other encapsulation techniques may be used to provide the protection for the sidewalls of the magnetic layers. For example, a combination of oxidation of the underlying material and deposition of additional encapsulating materials can occur. As another example, a material may be deposited overlying the sidewalls and then oxidized or processed in some other way to produce the encapsulation.

Figure 9:
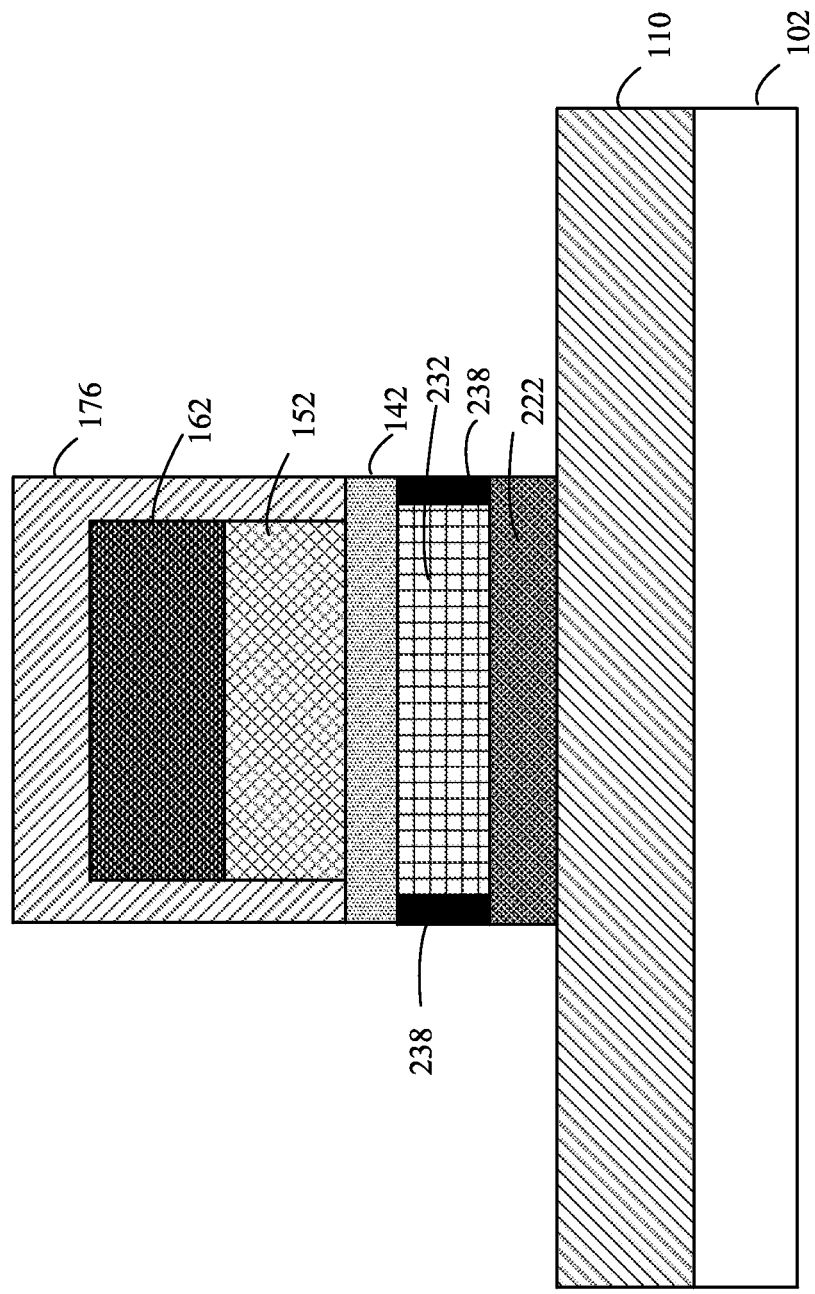

FIG. 9 shows a cross-sectional view corresponding to FIG. 8 following etching of the antiferromagnetic layer 120 to produce antiferromagnetic layer portion 222 included in the magnetoresistive device stack. As noted above, in other embodiments the upper magnetic material layer 152 may be the fixed layer such that the lower magnetic layer 232 is the free layer, and, in such instances, antiferromagnetic layer portion 222 may not be included in the magnetoresistive device stack. As also noted above, the anti-ferromagnetic layer 120 may include material such as platinum manganese that leaves behind residual material when etched, where such residual material can have detrimental effects on the characteristics of the resulting magnetoresistive device. However, the encapsulation 238 formed on the sidewalls of the lower magnetic layer 232 isolates those layers from any such residual material, thereby reducing or eliminating its impact on the switching characteristics of the device.

Figure 10:
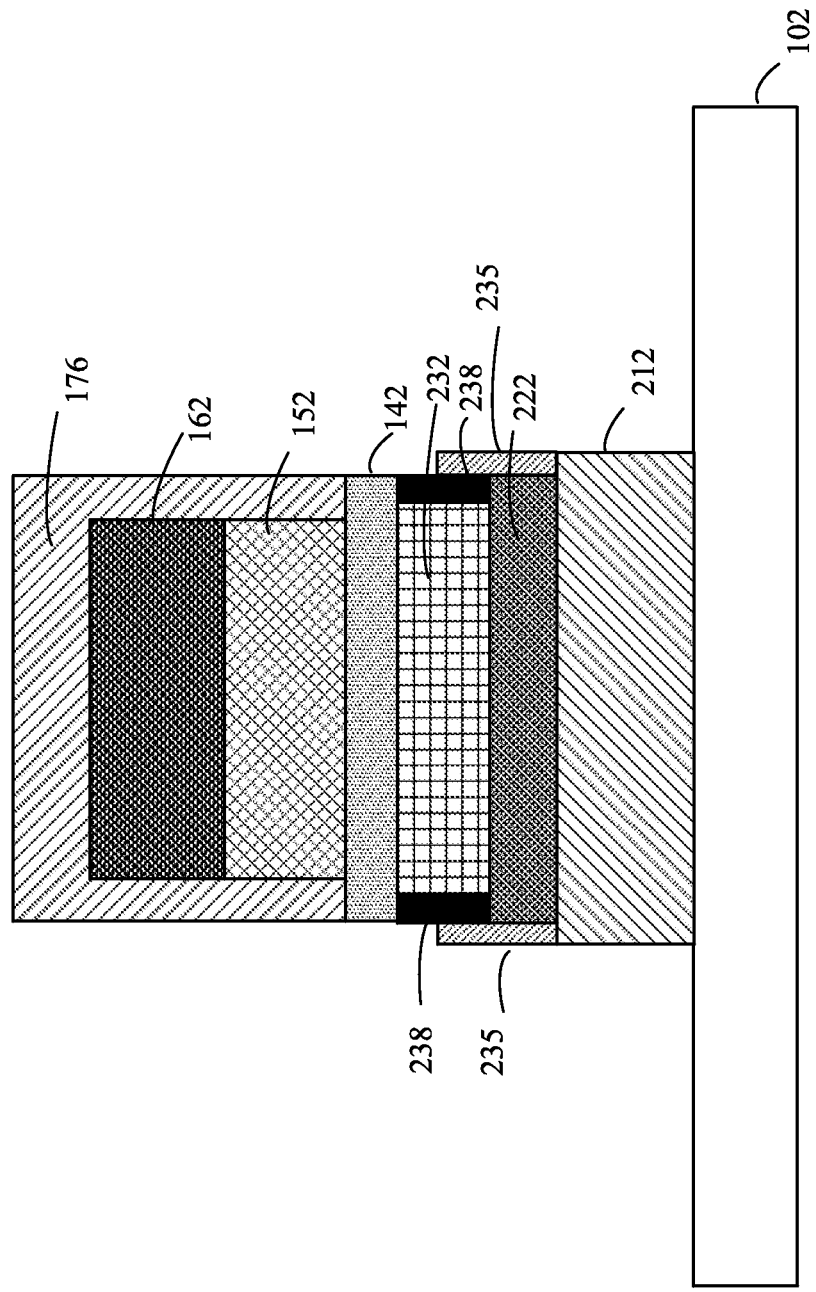

FIG. 10 illustrates veils 235 that may be formed during etching of the anti-ferromagnetic layer 222. As shown, the veils are isolated from the magnetic layer 232 by encapsulation material 238. FIG. 10 also shows the bottom electrode 212 having been defined from the lower layer of electrically conductive material 110. The bottom electrode 212 allows for an electrical connection to the lower portion of the magnetoresistive device. The hard mask 176 overlying the top electrode 162 is typically not removed until after the etching used to form the bottom electrode 212 is complete, as the hard mask 176 protects the top electrode 162 during that etching process. In order to provide access to the top electrode 162, the horizontal portion of the hard mask 176 may be later removed by, for example, a polishing step that exposes the top electrode 162.

Figure 11:
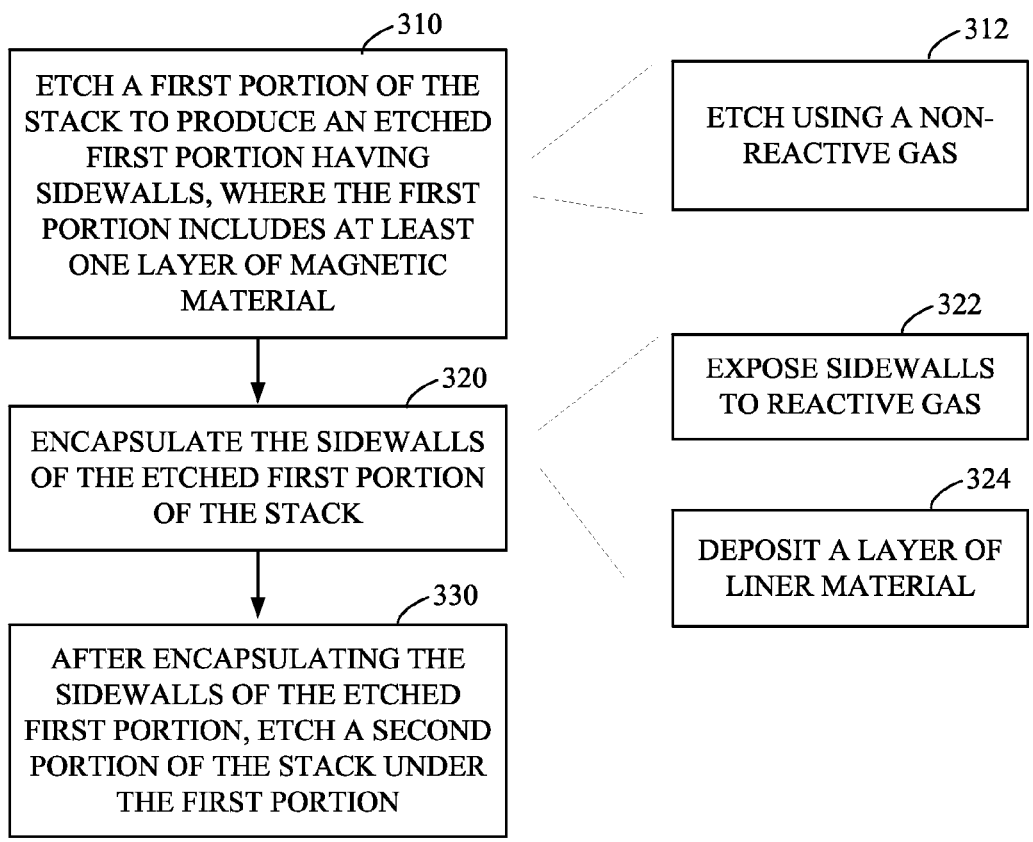
FIGS. 11-13 are flow charts of methods of manufacturing a magnetoresistive device in accordance with exemplary embodiments.
Figure 12:
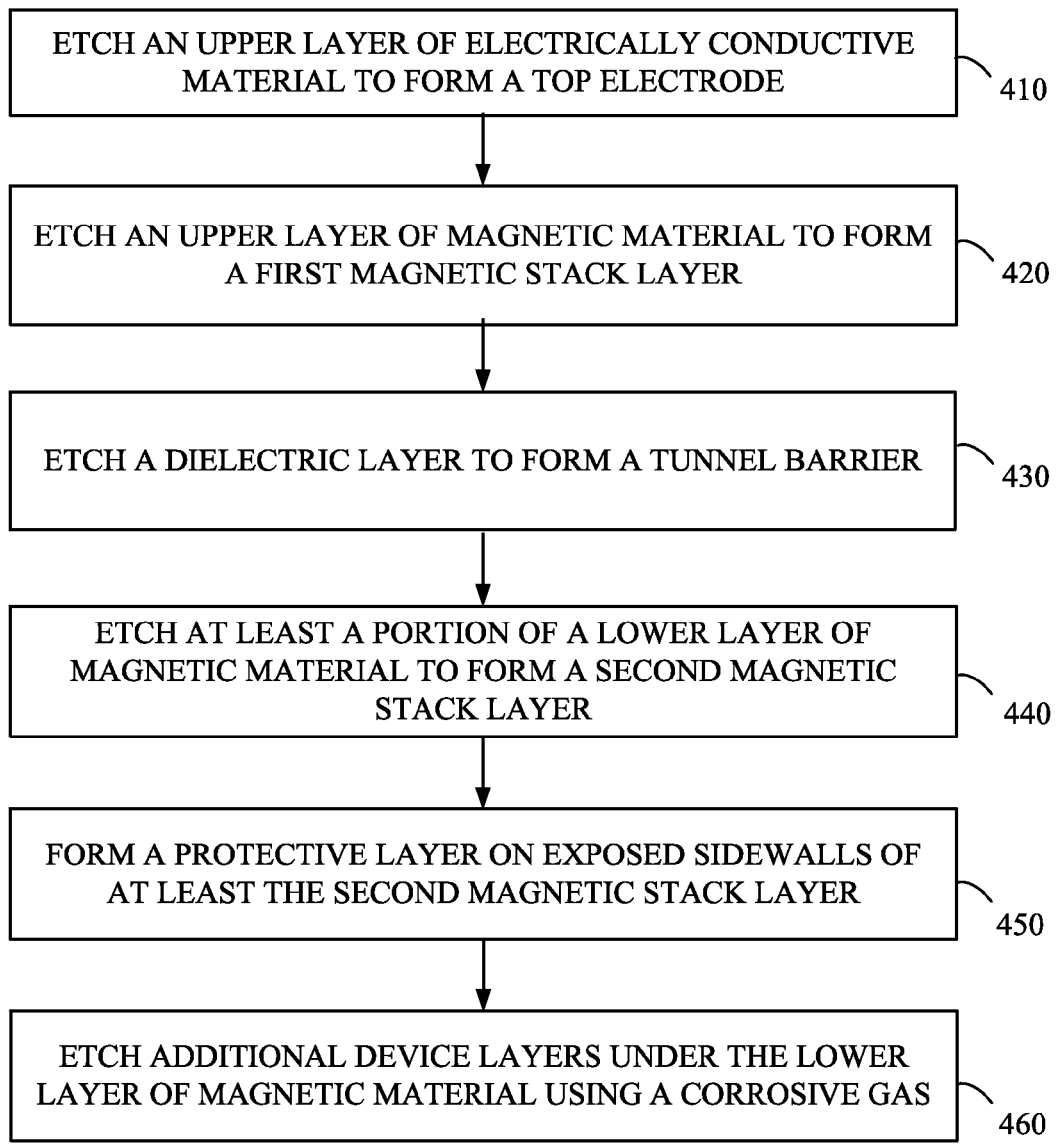
Figure 13:
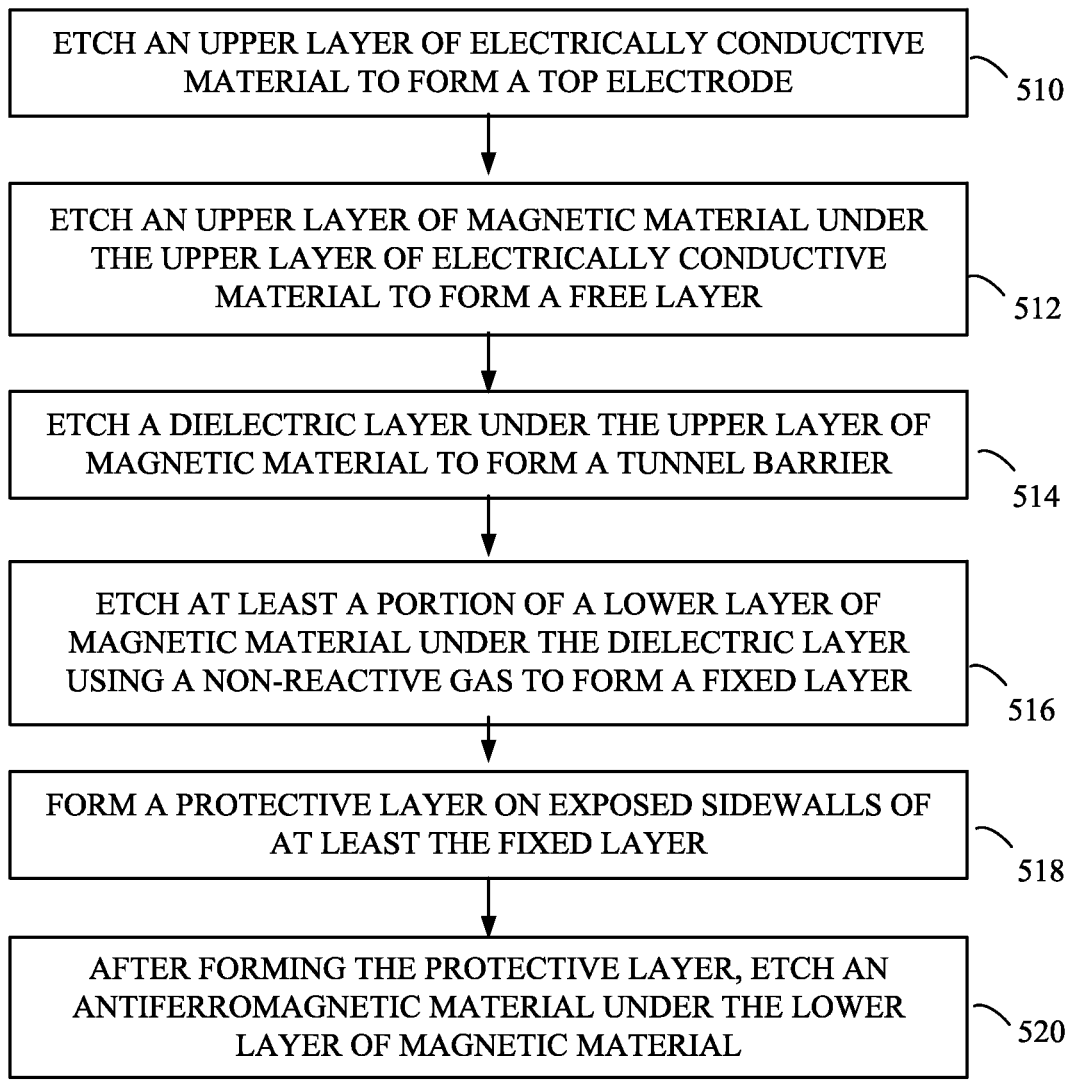

FIGS. 11-13 are flow charts that illustrate exemplary embodiments of a method of manufacturing a magnetoresistive device, where, in one example, the magnetoresistive device is a spin-torque MTJ device included in an MRAM. The operations included in the flow charts may represent only a portion of the overall process used to manufacture the device. The various tasks performed in connection with the methods of FIGS. 11-13 may be performed by software, hardware, firmware, or any combination thereof. For illustrative purposes, the following description of the methods in FIGS. 11-13 may refer to elements mentioned above in connection with FIGS. 1-10. In practice, portions of methods may be performed by different elements of the described system, e.g., a processor, a display element, or a data communication component. It should be appreciated that methods may include any number of additional or alternative tasks, the tasks shown in FIGS. 11-13 need not be performed in the illustrated order, and the methods may be incorporated into a more comprehensive procedure or process having additional functionality not described in detail herein. Moreover, one or more of the tasks shown in FIGS. 11-13 could be omitted from an embodiment as long as the intended overall functionality remains intact.

FIG. 11 illustrates a flow chart of a portion of the magnetoresistive device manufacturing process. Not shown in FIG. 11 is the deposition of the various layers making up the device and the etching of the top portion of the device, including etching of the top electrode and magnetic layer overlying the tunnel barrier for the device. At 310, a first portion of the stack is etched to produce an etched first portion having sidewalls, where the first portion includes at least one layer of magnetic material. The etching performed at 310 may also include etching a dielectric layer to form a tunnel barrier. In one example, the first portion of the stack may include a SAF structure associated within a fixed portion of a MTJ device, or, in another example, may correspond to a portion of such a SAF structure. In yet other embodiments, the first portion may correspond to some or all of a SYF structure associated with a free portion of a MTJ device. As shown in 312, the etching performed at 310 may be accomplished using a non-reactive gas in order to avoid degradation of the sidewalls as the layer or layers are being etched. For example, an argon (Ar) or other non-oxidizing etch may be employed in order to avoid oxidizing the magnetic layer as well as other layers that may also be etched.

At 320 the sidewalls of the etched first portion of the stack are encapsulated. As shown in 322 and 324, encapsulation may include exposing the sidewalls to a reactive gas (passivation) or depositing a layer of liner material on the sidewalls. In the case of exposing the sidewalls to a reactive gas, this may include oxidizing the sidewalls, nitridizing the sidewalls, or exposing the sidewalls to a corrosive gas to provide controlled corrosion of the sidewalls. In the case of depositing a layer of liner material on the sidewalls, the liner material is preferably a non-magnetic dielectric material that insulates the sidewalls from further etching steps.

At 330, after encapsulating the sidewalls of the etched first portion, a second portion of the stack under the first portion is etched to produce an etched second portion of the stack. In embodiments where the etching at 330 includes etching a fixed layer of the magnetoresistive device, the second portion of the stack may include a layer of anti-ferromagnetic material under the fixed layer. In order to etch the antiferromagnetic material, it may be preferable to use a corrosive gas that helps to remove material between magnetoresistive devices included in an array. Even so, as noted above, etching antiferromagnetic material, such as platinum manganese, can leave behind residual material that can interfere with proper device operation. As such, the encapsulation of the sidewalls at 320 not only protects the sidewalls from corrosive etching steps following encapsulation, but also isolates the sidewalls from any residual material left over from the subsequent etching steps. In some embodiments, an antiferromagnetic layer or other layer that leaves residual material will not be included in the second portion etched. As such, the encapsulation, while not providing isolation from residual material such as platinum, cobalt, or iron, still protects the sidewalls from corrosion during subsequent etching steps. One such subsequent etching step is that used to define the bottom electrode, and etching the second portion of the stack can include etching a lower layer of electrically conductive material to form the bottom electrode.

Certain techniques for forming the lower portion of the magnetoresistive device use a single reactive etch (e.g. using mixtures of argon and chlorine) to define the magnetic layers as well as those layers underlying the magnetic layers, such as the anti-ferromagnetic layer. Such techniques leave the sidewalls of the magnetic layers, and possibly the tunnel barrier, exposed to the chemistries of the etching, including during the time the layers underlying the magnetic layers are etched. Such exposure can result in oxidation or other degradation of the sidewalls of the magnetic layers. As noted above, one improvement to this technique is to split the single step etch into three steps, where a first reactive etch is followed by encapsulation, and the encapsulation is followed by a second reactive etch. As also noted above, a further improvement to that technique is to utilize a nonreactive etch prior to encapsulation, thereby preventing oxidation or degradation of the material being etched during the first etching step.

FIG. 12 illustrates a flow chart of a portion of the magnetoresistive device manufacturing process. Not shown in FIG. 12 is the deposition of the various layers making up the device, which can be achieved using conventional techniques or techniques later developed. At 410, an upper layer of electrically conductive material is etched to form a top electrode. As noted earlier, the technique used to form the top electrode is not dependent upon the techniques described herein for forming the lower portion of the magnetoresistive stack. As such, various etching techniques to form the top electrode can be used, including those described in co-pending U.S. patent application Ser. No. 14/296,181 entitled "Method for Top Electrode Etch in a Magnetoresistive Device and Devices Manufactured Using Same." Moreover, as is the case with the other etching operations described herein, the etching operations included in FIG. 12 may be accomplished based on a hard mask or a plurality of hard masks that ensure that only the portions of the various layers that need to be etched are removed.

At 420, an upper layer of magnetic material is etched to form a first magnetic stack layer. In one embodiment, the first magnetic stack layer corresponds to a free portion of the magnetic stack, whereas in other embodiments, the first magnetic stack layer may correspond to a fixed portion of the magnetoresistive device stack. As also noted above, the upper layer of magnetic material may include a plurality of different layers, including both magnetic and nonmagnetic layers as well as coupling layers that are interspersed between the magnetic and nonmagnetic layers. In some embodiments, the upper layer of magnetic material may include a spacer layer and a dielectric layer that, when etched, serves as a diffusion barrier.

At 430, a dielectric layer, which is positioned under the upper layer of magnetic material, is etched to form a tunnel barrier. Because the dielectric layer forming the tunnel barrier may be susceptible to oxidation or other degradation, a non-reactive etch may be used at 430. At 440, at least a portion of a lower layer of magnetic material is etched to form a second magnetic stack layer. In embodiments where the first magnetic stack layer includes a free magnetic layer, the second magnetic stack layer may include a fixed magnetic layer. For example, the first magnetic stack layer may include a SYF structure, and the second magnetic stack layer may include a SAF structure. In other embodiments, the free and fixed portions of the stack may be reversed such that the second magnetic stack layer constitutes the free magnetic layer.

The etching performed at 440 may be stopped at the edge of the lower layer of magnetic material such that the entire lower layer of magnetic material not underlying the hard mask is removed. As noted above, a determination as to when to stop the etching process can be based on time or the detection of certain material in an optical emission spectrum. In other embodiments, only a portion of the lower layer of magnetic material may be etched. For example, only certain layers or portions of layers within a SAF structure are etched in some embodiments. In yet other embodiments, in addition to etching through the entirety of the lower layer of magnetic material, the etching at 440 may continue into some portion of the underlying layers.

At 450, a protective layer is formed on the exposed sidewalls of at least the second magnetic stack layer. As described above with respect to FIGS. 1-10, the protective layer can include encapsulation material formed through deposition, passivation, or both. In the case of deposition, forming the protective layer includes depositing nonmagnetic dielectric material on the sidewalls. In the case of passivation, forming the protective layer includes exposing the sidewalls to a reactive gas, which may result in oxidization, nitridization, or some other form of controlled corrosion that forms a non-magnetic protective layer. In addition to protecting exposed sidewalls of the second magnetic stack layer, the protective layer may also encapsulate the sidewalls of the tunnel barrier as well as other vulnerable layers within the magnetic stack structure.

At 460, the additional device layers under the lower layer of magnetic material are etched using a corrosive etch chemistry, which can include a corrosive gas, corrosive plasma, or some combination thereof. The device layers under the lower layer of magnetic material can include an electrically conductive layer used to form the bottom electrode. In other embodiments, the device layers under the lower layer of magnetic material also include a layer of antiferromagnetic material such as platinum manganese. Etching platinum manganese using a reactive etch such as a combination of argon and chlorine can, as noted above, result in veils that can have undesirable interactions with the magnetic device structure.

The protective layer formed at 450 helps to ensure that the impact of any such veils is minimized.

FIG. 13 illustrates a flow chart of a portion of the magnetoresistive device manufacturing process. At 510, an upper layer of electrically conductive material is etched to form a top electrode. As noted above, the top electrode can be formed using a number of different techniques. At 512, an upper layer of magnetic material is etched to form a free layer. As described and shown above, the top electrode provides an electrical connection to the top side of the magnetoresistive device stack, and the free layer underlies the top electrode.

At 514 a dielectric layer under the upper layer of magnetic material is etched to form a tunnel barrier. At 516, at least a portion of a lower layer of magnetic material under the dielectric layer is etched to form a fixed layer. Thus, the free layer and the fixed layer are separated by the tunnel barrier. The etching performed at 516 may be accomplished using a non-reactive gas in order to minimize any degradation of the lower layer of magnetic material.

At 518, a protective layer is formed on the exposed sidewalls of at least the fixed layer. In some embodiments, the sidewalls of the tunnel barrier may also be encapsulated or protected. The protective layer may be formed by deposition, passivation, or some combination thereof. At 520, after forming the protective layer, an antiferromagnetic material under the lower layer of magnetic material is etched. The etching at 520 may use a corrosive etch which, if the magnetic layers were not protected, could interact with the sidewalls of the magnetic layers and result in undesirable distributions of switching characteristics in an array of magnetoresistive devices, such as those used in an MRAM.

By dividing a single step etch into three separate steps, unwanted oxidation or other degradation of magnetic layer sidewalls is avoided. In addition, potential interference from veils resulting from subsequent etching steps is also minimized. The first step, a nonreactive etch, defines the tunnel barrier and lower magnetic layer. The second step, encapsulating the sidewalls of vulnerable layers, protects those layers from degradation and interaction with residual material. The third step, a reactive, corrosive etch completes the definition of the magnetoresistive device stack in a manner that provides proper isolation between neighboring magnetoresistive devices yet does not negatively impact the encapsulated layers.

Although the described exemplary embodiments disclosed herein are directed to various magnetoresistive-based devices and methods for making such devices, the present disclosure is not necessarily limited to the exemplary embodiments, which illustrate inventive aspects that are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method of manufacturing a magnetoresistive device that includes a magnetoresistive stack, comprising:

etching a first portion of the magnetoresistive stack with a non-reactive etch to produce an etched first portion of the magnetoresistive stack having sidewalls, where the first portion of the magnetoresistive stack includes a first dielectric layer corresponding to a tunnel barrier layer for the device and at least one layer of magnetic material, wherein etching the first portion with the non-reactive etch prevents oxidation or other degradation of the tunnel barrier layer and the at least one layer of magnetic material during the etching of the first portion;

after etching the first portion of the magnetoresistive stack, encapsulating the sidewalls of the etched first portion of the magnetoresistive stack; and after encapsulating the sidewalls of the etched first portion of the magnetoresistive stack, etching a second portion of the magnetoresistive stack with a reactive, corrosive etch to produce an etched second portion of the magnetoresistive stack, wherein the second portion of the magnetoresistive stack includes a layer of antiferromagnetic material, and where the first portion of the magnetoresistive stack is over the second portion of the magnetoresistive stack.

2. The method of claim 1, wherein the at least one layer of magnetic material includes a synthetic antiferromagnetic (SAF) structure, and wherein etching the first portion includes etching through the tunnel barrier layer and at least a portion of the SAF structure.

3. The method of claim 1, wherein the at least one layer of magnetic material includes a fixed layer, and wherein etching the first portion of the magnetoresistive stack further comprises etching at least a portion of the fixed layer.

4. The method of claim 3, wherein the fixed layer is over the layer of antiferromagnetic material, and wherein etching the first portion further comprises etching through the fixed layer until reaching the layer of antiferromagnetic material.

5. The method of claim 1 further comprising, prior to etching the first dielectric layer, etching a free layer.

6. The method of claim 5, wherein the free layer is included in a synthetic ferromagnetic (SYF) structure.

7. The method of claim 1, wherein encapsulating the sidewalls includes at least one of oxidizing the sidewalls, nitridizing the sidewalls, and exposing the sidewalls to a corrosive gas to provide controlled corrosion of the sidewalls.

8. The method of claim 1, wherein encapsulating the sidewalls includes depositing a layer of liner material on the sidewalls, wherein the liner material is non-magnetic dielectric material.

9. The method of claim 1 further comprising:

encapsulating sidewalls of the etched second portion of the magnetoresistive stack; and after encapsulating the sidewalls of the etched second portion of the stack, etching a third portion of the magnetoresistive stack, where the second portion of the magnetoresistive stack is over the third portion of the magnetoresistive stack.

10. The method of claim 1 wherein etching the second portion of the magnetoresistive stack includes etching the second portion using a mixture of at least one noble gas and at least one corrosive gas.

11. The method of claim 10, wherein etching the first portion of the magnetoresistive stack includes etching the first portion using a non-oxidizing argon etch.

12. The method of claim 1 wherein etching the second portion of the magnetoresistive stack includes etching a lower layer of electrically conductive material to form a bottom electrode.

13. A method of manufacturing a magnetoresistive device, comprising:
- etching an upper layer of electrically conductive material to form a top electrode;
- etching an upper layer of magnetic material under the upper layer of electrically conductive material to form a first magnetic stack layer;
- etching a dielectric layer under the upper layer of magnetic material to form a tunnel barrier;
- etching at least a portion of a lower layer of magnetic material under the first dielectric layer using a non-reactive etch to form a second magnetic stack layer;
- forming a protective layer on exposed sidewalls of at least the second magnetic stack layer; and
- after forming the protective layer, etching additional device layers under the lower layer of magnetic material using a reactive, corrosive etch chemistry.

14. The method of claim 13, wherein etching the additional device layers under the lower layer of magnetic material includes etching at least a portion of a layer of antiferromagnetic material.

15. The method of claim 14, wherein etching the additional device layers under the lower layer of magnetic material includes etching a layer of platinum manganese.

16. The method of claim 13, wherein etching the additional device layers under the lower layer of magnetic material includes etching a lower layer of electrically conductive material to form a bottom electrode.

17. The method of claim 13, wherein:
- etching the upper layer of magnetic material includes etching a free magnetic layer for the magnetoresistive device; and
- etching the lower layer of magnetic material includes etching a fixed magnetic layer for the magnetoresistive device.

18. The method of claim 13, wherein forming the protective layer includes depositing non-magnetic dielectric material on the sidewalls.

19. The method of claim 13, wherein forming the protective layer includes exposing the sidewalls to a reactive gas.

20. The method of claim 13, wherein forming a protective layer on exposed sidewalls of at least the second magnetic stack layer further includes forming a protective layer on exposed sidewalls of the tunnel barrier.

21. A method of manufacturing a magnetoresistive device, comprising:
- etching an upper layer of electrically conductive material to form a top electrode;
- etching an upper layer of magnetic material under the upper layer of electrically conductive material to form a free layer;
- etching a dielectric layer under the upper layer of magnetic material to form a tunnel barrier;
- etching at least a portion of a lower layer of magnetic material under the dielectric layer using a non-reactive etch to form a fixed layer;
- forming a protective layer on exposed sidewalls of at least the fixed layer; and
- after forming the protective layer, etching an antiferromagnetic material under the lower layer of magnetic material using a reactive, corrosive etch chemistry.

22. The method of claim 21, wherein etching at least a portion of the lower layer of magnetic material includes etching the at least a portion of the lower layer of magnetic material using a noble gas that prevents oxidation or other degradation of the tunnel barrier layer and the at least a portion of the lower layer of magnetic material.

23. The method of claim 1, wherein etching the first portion of the magnetoresistive stack further comprises etching the first portion using a gas consisting of one of argon and xenon.

24. The method of claim 1, wherein etching the first portion of the magnetoresistive stack further comprises etching the first portion using a noble gas.

* * * * *